(12) United States Patent
Kojima

(10) Patent No.: US 7,956,390 B2
(45) Date of Patent: Jun. 7, 2011

(54) SEMICONDUCTOR DEVICE AND MANUFACTURING METHOD THEREOF

(75) Inventor: Manabu Kojima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 407 days.

(21) Appl. No.: 12/194,052

(22) Filed: Aug. 19, 2008

(65) Prior Publication Data

US 2009/0050979 A1 Feb. 26, 2009

(30) Foreign Application Priority Data

Aug. 20, 2007 (JP) ................... 2007-214088

(51) Int. Cl.
*H01L 29/66* (2006.01)
(52) U.S. Cl. .. 257/262; 257/369; 257/392; 257/E29.193
(58) Field of Classification Search .................. None
See application file for complete search history.

(56) References Cited

U.S. PATENT DOCUMENTS

2007/0102755 A1* 5/2007 Adams et al. ................. 257/324

OTHER PUBLICATIONS

Paul Grudowski et al."1-D and 2-D Geometry Effects in Uniaxially-Strained Dual Etch Stop Layer Stressor Integrations," 2006 Symposium on VLSI Technology; The Japan Society of Applied Physics; Jun. 13-15, 2006; pp. 76-77.

* cited by examiner

*Primary Examiner* — Evan Pert
*Assistant Examiner* — Scott Wilson
(74) *Attorney, Agent, or Firm* — Westerman, Hattori, Daniels & Adrian, LLP

(57) ABSTRACT

A semiconductor device having a semiconductor substrate, a first impurity region including a first conductive impurity formed in the semiconductor substrate, a first transistor and a second transistor formed in the first impurity region, a first stress film and a second stress having a first stress over the first transistor a and the second transistor, and a third stress film having a second stress different from the first stress provided in the first impurity region between the first stress film and the second stress film.

16 Claims, 11 Drawing Sheets

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2007-214088, filed on Aug. 20, 2007, the entire content of which is incorporated herein by reference.

BACKGROUND

The present invention relates to a semiconductor device and a manufacturing method thereof, and in particular, relates to a semiconductor device equipped with a transistor.

It is known that, in a transistor such as a metal oxide semiconductor (MOS) transistor, mobility of electrons or holes is improved by applying a stress to a channel region. Mobility of electrons is improved in an n-type transistor by applying a tensile stress to a channel region and mobility of holes is improved in a p-type transistor by applying a compressive stress to a channel region.

A technology to cover the transistor with a silicon nitride film is available as a technology to provide a stress to the transistor. A tensile stress can be applied to a channel region of the MOS transistor covered by a silicon nitride film having a tensile stress. The silicon nitride film having a tensile stress is deposited by controlling film formation conditions in the formation process of the silicon nitride film to cause the deposited silicon nitride film to shrink. Also, a compressive stress can be applied to a channel region by depositing a silicon nitride film having a compressive stress. The silicon nitride film having a compressive stress is deposited by controlling film formation conditions in the formation process of the silicon nitride film to cause the deposited silicon nitride film to expand. Moreover, there is proposed a technology to form a silicon nitride film, which is a stress film, as an etching stopper film for forming a contact hole in an inter-layer insulating film after a gate electrode of a transistor is covered with the silicon nitride film and further the silicon nitride film is covered with the inter-layer insulating film.

For example, when a large scale integrated (LSI) circuit containing a circuit block having a specific function such as a phase locked loop (PLL) circuit is manufactured, it is necessary to evaluate performance of the circuit block alone in a development phase before the circuit block is incorporated into the LSI circuit to guarantee performance of the circuit block. It is also preferable to be able to guarantee almost the same performance even if a circuit block is applied to a different LSI circuit after being evaluated.

In a CMOS transistor equipped with an n-type MOS transistor and a p-type MOS transistor, a first silicon nitride film applying a tensile stress to a channel region may be formed in a formation region of the n-type transistor and a second silicon nitride film applying a compressive stress to a channel region may be formed in the formation region of the p-type transistor. In such a case, if the distance between edge portions of the first silicon nitride film and the second silicon nitride film and the channel region of the n-type MOS transistor and that of the p-type MOS transistor changes, magnitudes of stress applied to the channel region of the n-type MOS transistor and that of the p-type MOS transistor change. Due to the changes in magnitude of the stress, mobility of the n-type MOS transistor and the p-type MOS transistor changes, leading to fluctuations in performance of the CMOS transistor.

SUMMARY

According to an aspect of the invention, a semiconductor device has a semiconductor substrate, a first impurity region including a first conductive impurity formed in the semiconductor substrate, a first transistor and a second transistor formed in the first impurity region, a first stress film and a second stress film having a first stress over the first transistor and the second transistor, and a third stress film having a second stress different from the first stress provided in the first impurity region between the first stress film and the second stress film.

DETAILED DESCRIPTION

Figure 1A:
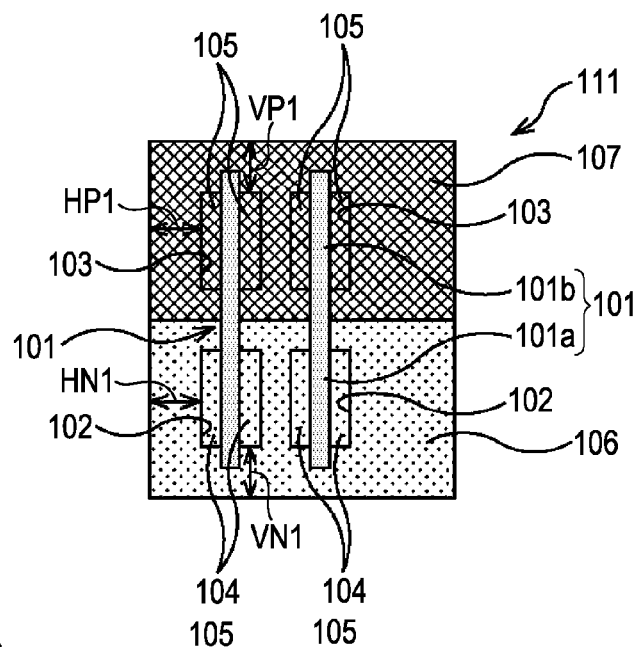
FIGS. 1A and 1B are plan views showing a circuit block.

FIG. 1A is a plan view of a circuit block 111 equipped with a plurality of CMOS transistors.

Each CMOS transistor has a gate electrode 101 within an n-type region 101a and a p-type region 101b. Source/drain regions 104/105 are formed in active regions 102/103, respectively. The circuit block 111 is covered with a first silicon nitride film 106 and a second silicon nitride film 107.

In FIG. 1A, it is assumed that a horizontal distance from the source/drain region 104 of the n-type MOS transistor to an edge portion of the first silicon nitride film 106 is HN1 and a vertical distance is VN1, and the horizontal distance from the source/drain region 105 of the p-type MOS transistor to the edge portion of the second silicon nitride film 107 is HP1 and the vertical distance is VP1.

Figure 1B:
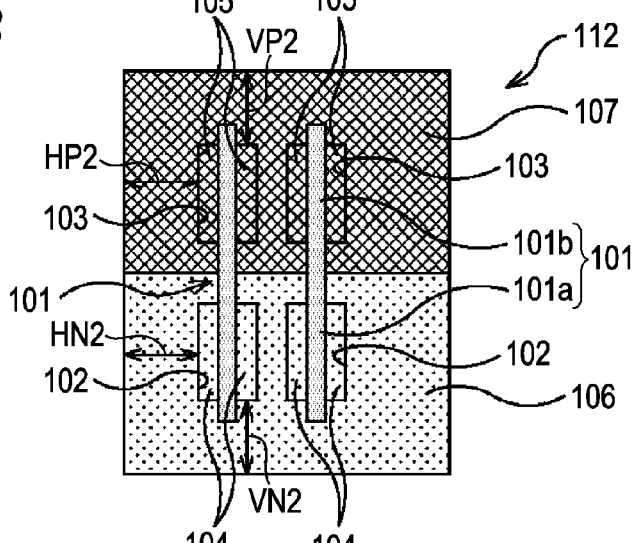

Likewise, FIG. 1B is a plan view of a circuit block 112 having a plurality of CMOS transistors. It is assumed that the horizontal distance from the source/drain region 104 of the n-type MOS transistor to the edge portion of the first silicon nitride film 106 is HN2 and the vertical distance is VN2, and the horizontal distance from the source/drain region 105 of the p-type MOS transistor to the edge portion of the second silicon nitride film 107 is HP2 and the vertical distance is VP2.

While the circuit block 111 and the circuit block 112 have the same configuration of the CMOS transistor, HN1 and HN2 are different, VN1 and VN2 are different, HP1 and HP2 are different, and VP1 and VP2 are different. These differences make characteristics of CMOS transistors different even though the circuit block 111 and the circuit block 112 have the same circuit configuration.

Figure 2:
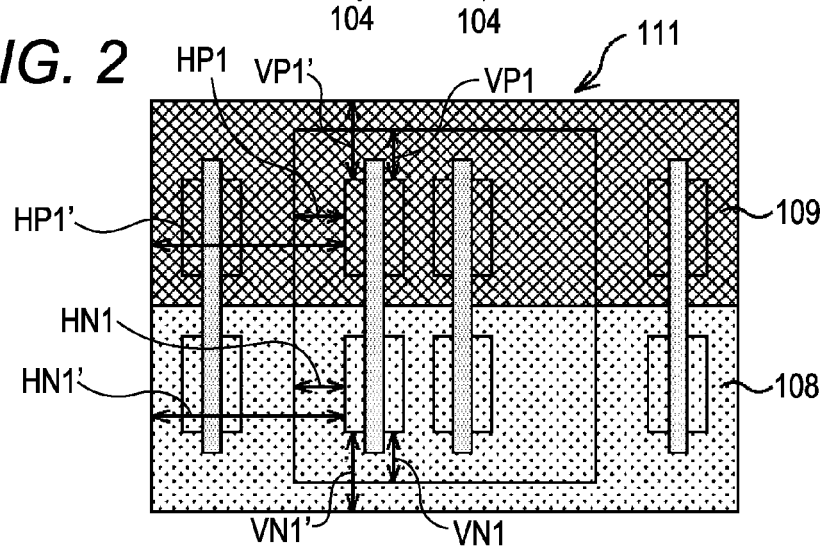
FIG. 2 is a plan view of an LSI circuit including the circuit block.

FIG. 2 is a plan view of an LSI circuit having the circuit block 111. A silicon nitride film 108, which is a tensile stress film, is formed around the first silicon nitride film 106. Also, a silicon nitride film 109, which is a compressive stress film, is formed around the second silicon nitride film 107. Therefore, distances from the transistor to edge portions of the tensile stress film over the transistor are not practically HN1, VN1, HP1, and VP1, but HN1', VN1', HP1', and VP1', respectively. Accordingly, characteristics of the circuit block 111 will be different from those anticipated when the circuit block 111 is designed.

In the present embodiment, a semiconductor substrate has a first region where a first transistor is formed and a second region where a second transistor is formed. Over the semiconductor substrate, a first film covering the first region and applying a tensile stress to a channel region and a second film covering the second region and applying a compressive stress to the channel region are formed. Further, a third film surrounding an edge portion of the first film and having a compressive stress and a fourth film surrounding the edge portion of the second film and having a tensile stress are formed. The first film and the second film are surrounded by the third film and the fourth film respectively, and the distance from the first transistor to the edge portion of the first film and that from the second transistor to the edge portion of the second film are specified to fixed values.

If a circuit block is incorporated into an LSI circuit based on the above configuration, fluctuations of characteristics of the circuit block depending on the layout of the circuit block in the LSI circuit can be suppressed.

The first film and the fourth film having a tensile stress may be formed simultaneously, and also the second film and the third film having a compressive stress may be formed simultaneously. If the first film and the fourth film should have different strengths of stress, these films may be formed indifferent formation processes using different film formation conditions.

A CMOS transistor having an nMOS transistor and a pMOS transistor as a semiconductor device will be exemplified below. The semiconductor device may have at least one of an n-type transistor and a p-type transistor.

Figure 3A:
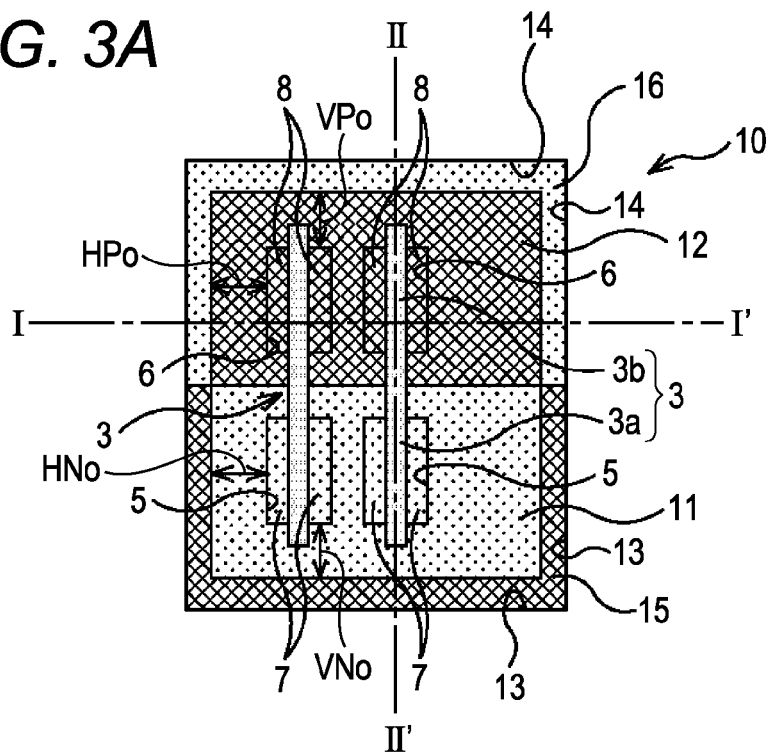
FIGS. 3A to 3C are diagrams showing a structure of the circuit block according to an embodiment.
Figure 3B:
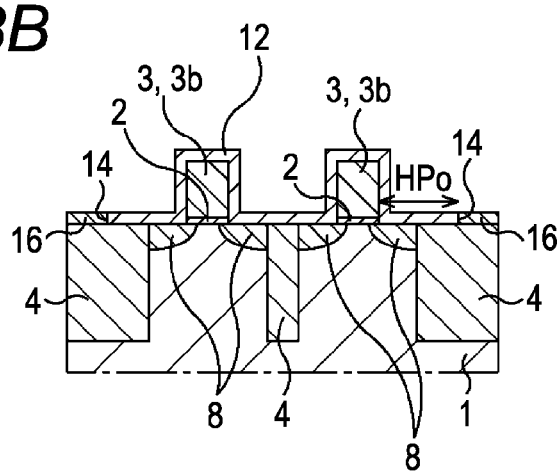
Figure 3C:
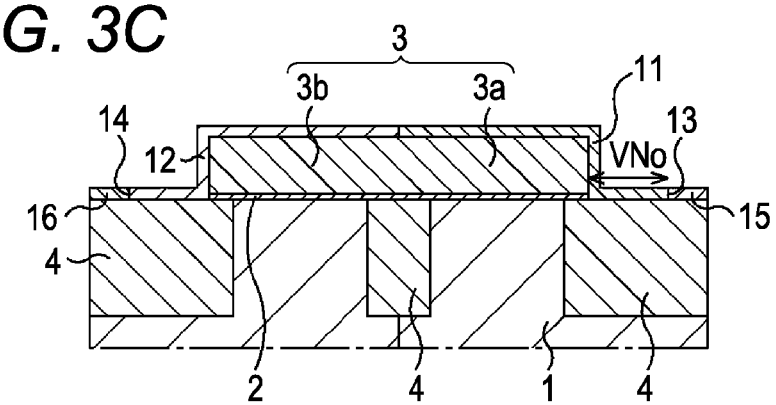

FIG. 3A shows a plan view of a circuit block 10 according to the embodiment, FIG. 3B is a sectional view along a I-I' line in FIG. 3A, and FIG. 3C is a sectional view along a II-II' line in FIG. 3A.

Figure 4A:
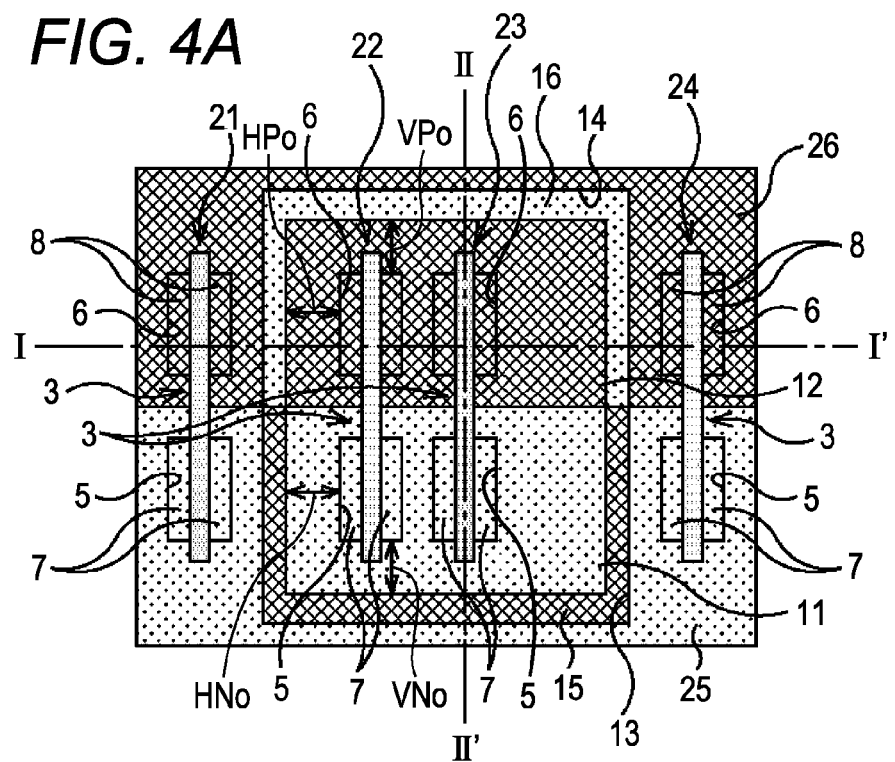
FIGS. 4A to 4C are diagrams showing the structure of the LSI circuit according to the embodiment.
Figure 4B:
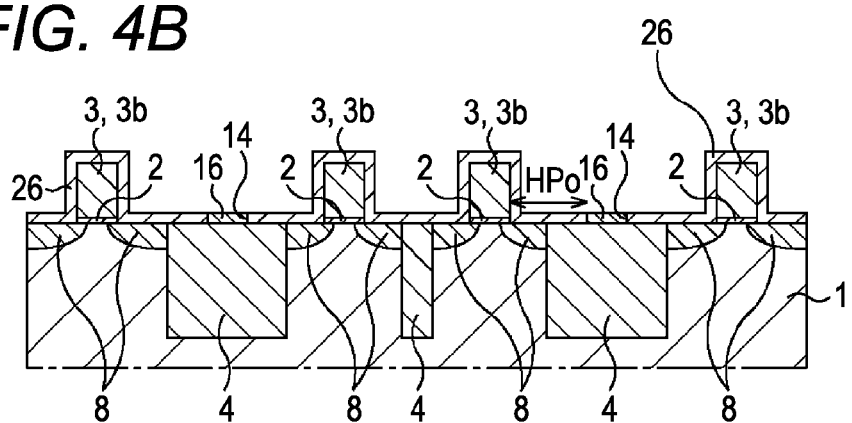
Figure 4C:
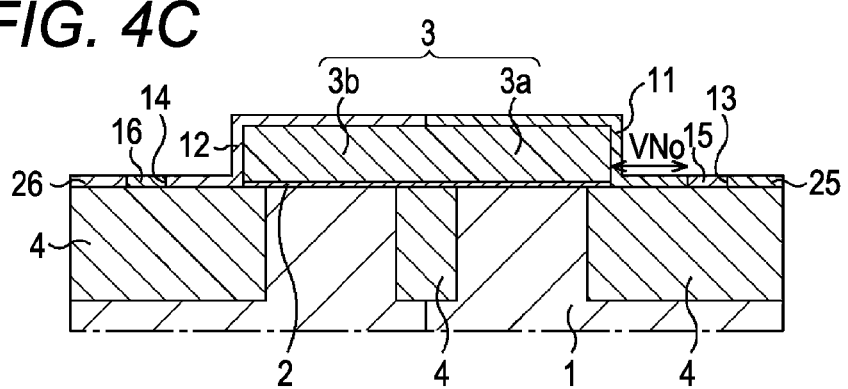

FIG. 4A is a plan view of an LSI circuit containing the circuit block 10, FIG. 4B is a sectional view along a I-I' line in FIG. 4A, and FIG. 4C is a sectional view along a II-II' line in FIG. 4A.

The circuit block 10 in the present embodiment has a plurality of CMOS transistors, but the number of transistors contained in the circuit block 10 may be one. In FIG. 3B, a gate insulating film 2 is formed over a semiconductor substrate 1 and a gate electrode 3 is formed over the gate insulating film 2. As shown in FIG. 3C, the gate electrode 3 has an n-type portion 3a and a p-type portion 3b. Shallow trench isolation (STI) 4 is formed in the semiconductor substrate 1 as an element isolation insulating film. Source/drain regions 7/8 are formed at both sides of the gate electrode 3 in active regions 5/6 demarcated by the STI 4. Further, the circuit block 10 has a first silicon nitride film 11 covering the n-type gate electrode 3a and applying a tensile stress to the channel region of an n-type MOS transistor and a second silicon nitride film 12 covering the p-type gate electrode 3b and applying a compressive stress to the channel region of a p-type MOS transistor. The first silicon nitride film 11 and the second silicon nitride film 12 may be used as an etching stopper film when a contact hole is formed in an inter-layer insulating film.

The circuit block 10 is provided with a third silicon nitride film 15 surrounding the edge portion of the first silicon nitride film 11 and having a different stress from that of the first silicon nitride film 11, and a fourth silicon nitride film 16 surrounding the edge portion of the second silicon nitride film 12 and having a different stress from that of the second silicon nitride film 12. The third film is a compressive stress film and the fourth film is a tensile stress film.

The first silicon nitride film 11 and the third silicon nitride film 15 have different stresses, and the second silicon nitride film 12 and the fourth silicon nitride film 16 have different stresses. With the presence of the third silicon nitride film 15 and the fourth silicon nitride film 16, the distance from the n-type MOS transistor to the edge portion of the first silicon nitride film 11 and that from the p-type MOS transistor to the edge portion of the second silicon nitride film 12 are fixed regardless of where in the LSI circuit the circuit block 10 is arranged. In FIG. 3A, if the horizontal distance from the active region 5 of the n-type MOS transistor to the edge portion of the first silicon nitride film 11 is HN, the vertical distance is VN, the horizontal distance from the active region 6 of the p-type MOS transistor to the edge portion of the second silicon nitride film 12 is HP, and the vertical distance is VP, HN is fixed to HN0, VN to VN0, HP to HP0, and VP to VP0.

A case where the circuit block 10 is incorporated into an LSI circuit will be described.

As shown in FIG. 4A, the LSI circuit has the circuit block 10 and other CMOS transistors 21 and 24. In FIG. 4A, the lower side is a region of the n-type MOS transistor and the upper side is a region of the p-type MOS transistor.

A fifth silicon nitride film 25 covering n-type MOS transistors of the CMOS transistors 21 and 24 and applying a tensile stress to the channel region is formed. The fifth silicon nitride film 25 may be formed from the same material as that of the first silicon nitride film 11 and under the same film formation conditions as those of the first silicon nitride film 11. On the other hand, a sixth silicon nitride film 26 covering p-type MOS transistors of the CMOS transistors 21 and 24 and applying a compressive stress to the channel region is formed. The sixth silicon nitride film 26 may be formed from the same material as that of the second silicon nitride film 12 and under the same film formation conditions as those of the second silicon nitride film 12.

The third silicon nitride film 15 is arranged between the first silicon nitride film 11 and the fifth silicon nitride film 25 and the fourth silicon nitride film 16 is arranged between the second silicon nitride film 12 and the sixth silicon nitride film 26. Thus, even if the circuit block 10 is incorporated into the LSI circuit, the third silicon nitride film 15 and the fourth silicon nitride film 16 are provided so as to surround the first silicon nitride film 11 and the second silicon nitride film 12 and thus, each of the above distances HN, VN, HP, and VP does not change and is held at HN0, VN0, HP0, and VP0, respectively. In this case, with the presence of the third silicon nitride film 15 and the fourth silicon nitride film 16, an influence of stress on the first silicon nitride film 11 and the second silicon nitride film 12 from the fifth silicon nitride film 25 and the sixth silicon nitride film 26 is mitigated respectively. With this configuration, anticipated device characteristics of CMOS transistors 22 and 23 are guaranteed regardless of the position of incorporation of the circuit block 10 within the LSI circuit.

Here, similarly by specifying distances of the CMOS transistors 21 and 24 to the third silicon nitride film 15 and the fourth silicon nitride film 16, device characteristics of the CMOS transistors 21 and 24 are maintained constant regardless of the position of the circuit block 10 in the LSI circuit. Incidentally, the third silicon nitride film 15 and the fourth silicon nitride film 16 may be a non-stress film or, instead of a silicon nitride film, a non-stress silicon oxide film may be used.

The manufacturing process of an LSI circuit in which the circuit block 10 is incorporated will be described below.

FIGS. 5A to 5D are sectional views corresponding to the I-I' line in FIG. 4 and FIGS. 6A to 6D are sectional views corresponding to the II-II' line in FIG. 4.

Figure 5A:
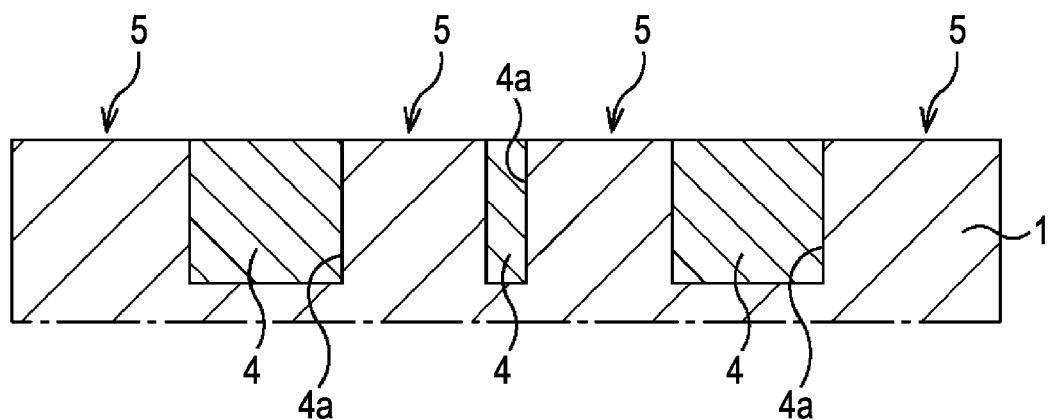
FIGS. 5A to 5D are diagrams showing a manufacturing process of the LSI circuit in a I-I' section in FIG. 4A.
Figure 6A:
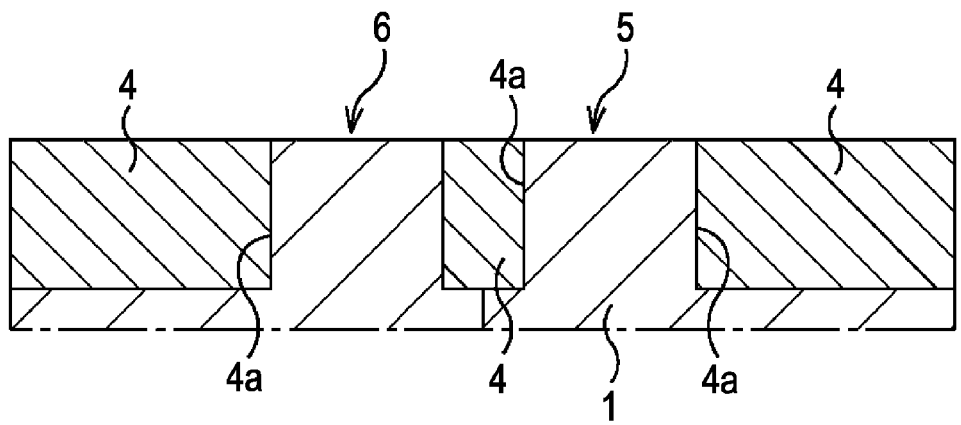
FIGS. 6A to 6D are diagrams showing the manufacturing process of the LSI circuit in a II-II' section in FIG. 4A.

As shown in FIGS. 5A and 6A, the STI 4 and the active regions 5/6 are formed.

More specifically, an isolation trench 4a is formed in an element isolation region of the semiconductor substrate 1, an insulating film, for example, a silicon oxide film is formed in the isolation trench 4a, and then the silicon oxide film is planarized by the chemical mechanical polishing (CMP) method or the like.

Figure 5B:
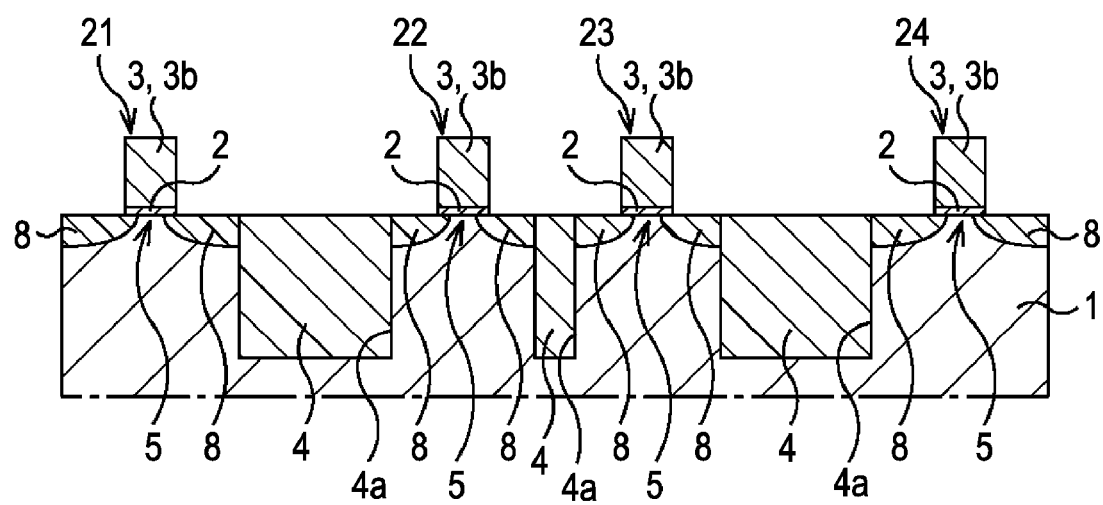
Figure 6B:
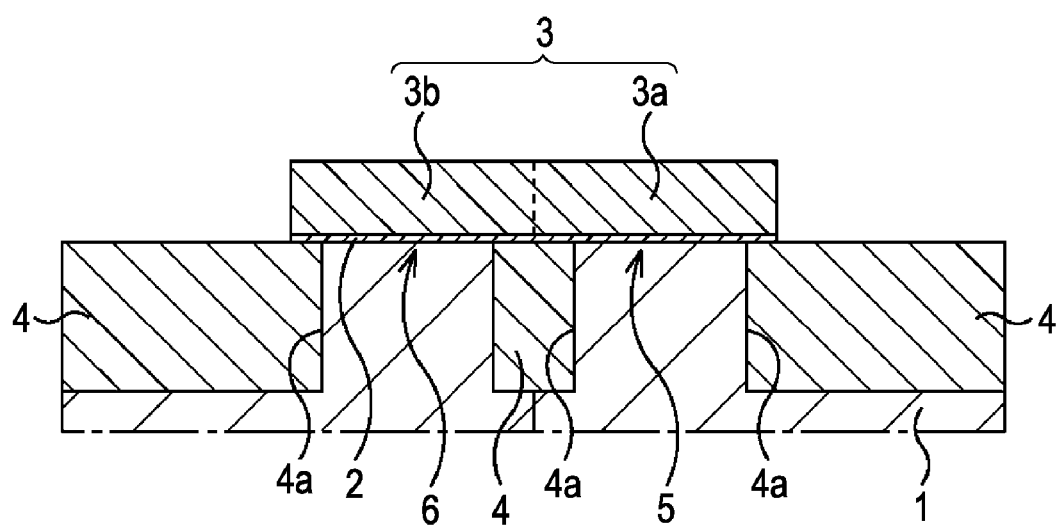

Then, as shown in FIGS. 5B and 6B, the gate insulating film 2, the gate electrode 3, and the source/drain regions 7/8 are formed in the active regions 5/6.

More particularly, first, a thin silicon oxide film is formed over the active regions 5/6 by the thermal oxidation method or the like to produce the gate insulating film 2.

A polysilicon film is deposited over the whole surface of the gate insulating film 2 by chemical vapor deposition (CVD) method or the like and the polysilicon film is processed by lithography and dry etching to an electrode shape to form the gate electrode 3. Here, the gate electrode 3 has the n-type portion 3a and the p-type portion 3b.

A resist mask covering a region of the p-type MOS transistor shown in FIG. 4A is formed and n-type impurities, for example, phosphorus ions are implanted in the active region 5 of a region of the n-type MOS transistor. The source/drain regions 7 are thereby formed on both sides of the gate electrode 3a in the active region 5.

After the above resist mask is removed by incineration or the like, a resist mask covering a region of the n-type MOS transistor shown in FIG. 4A is formed and p-type impurities, for example, boron ions are implanted in the active region 6 of a region of the p-type MOS transistor. The source/drain regions 8 are thereby formed at both sides of the gate electrode 3b in the active region 6.

Figure 5C:
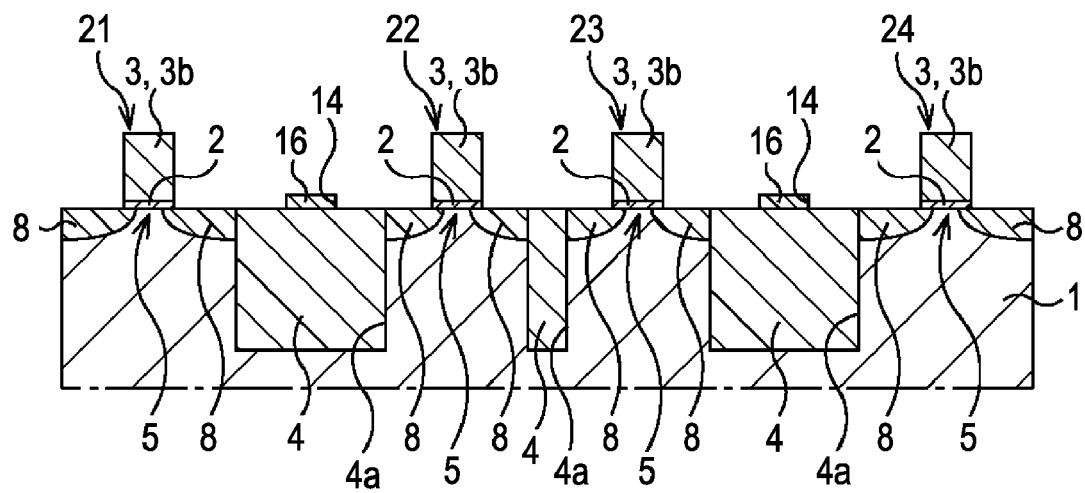
Figure 6C:
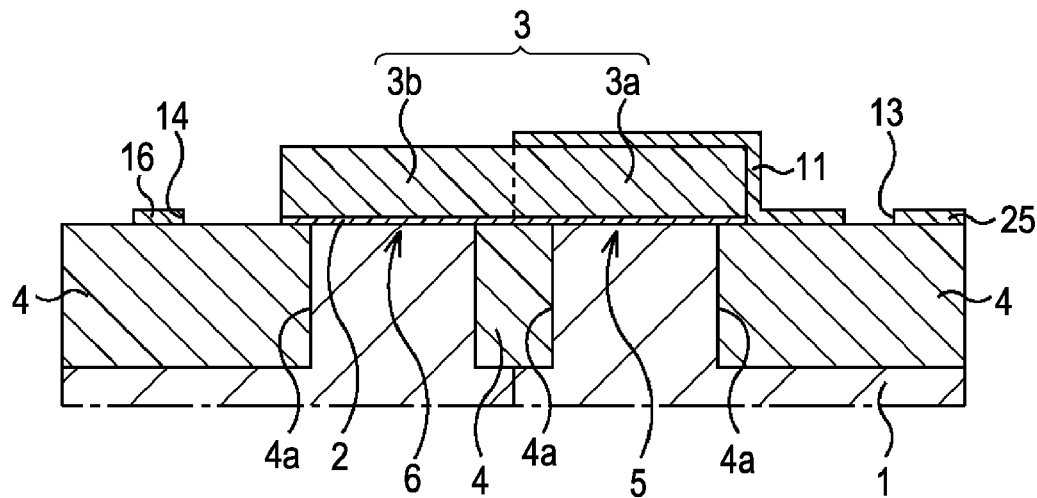

As shown in FIGS. 5C and 6C, the first silicon nitride film 11, the fourth silicon nitride film 16, and the fifth silicon nitride film 25 are formed.

More specifically, a thin film, for example, a silicon nitride film having a property to apply a tensile stress to the channel region of the n-type MOS transistor is formed. For the formation of the silicon nitride film, for example, the CVD method is used and $SiH_2Cl_2$ as a material gas is supplied at the flow rate of 5 sccm to 50 sccm, for example, 20 sccm. The thickness of the silicon nitride film is, for example, about 70 nm.

The silicon nitride film formed in this manner is processed by lithography and dry etching to form the first silicon nitride film 11 covering the n-type MOS transistor, the fourth silicon nitride film 16, and the fifth silicon nitride film 25 covering the n-type MOS transistor of the CMOS transistors 21 and 24.

Here, it is appropriate for the fourth silicon nitride film 16 to have a width of 50 nm or more to mitigate an external stress to the circuit block 10. Moreover, to prevent reduction in integration degree of a circuit, the width of 300 nm or less, for example, 200 nm is desirable.

Figure 5D:
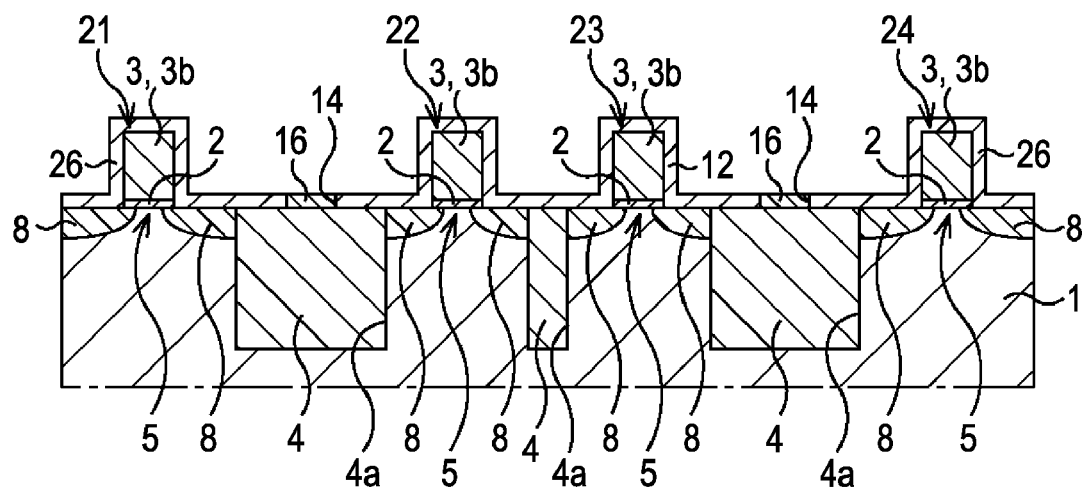
Figure 6D:
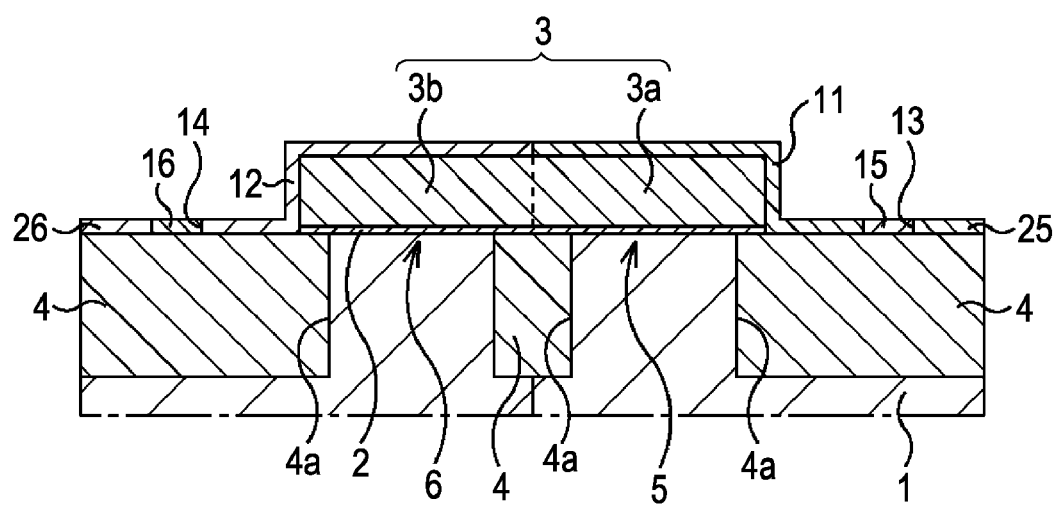

As shown in FIGS. 5D and 6D, the second silicon nitride film 12, the third silicon nitride film 15, and the sixth silicon nitride film 26 are formed. More specifically, a thin film having a property to apply a compressive stress to the channel region of the p-type MOS transistor, here a silicon nitride film having a property of expansion is formed over the first silicon nitride film 11, the fourth silicon nitride film 16, and the fifth silicon nitride film 25. For example, the CVD method is used and the material gas $SiH_4$ is supplied at the flow rate of 100 sccm to 1000 sccm, for example, 500 sccm to grow the silicon nitride film to a thickness of about 70 nm.

The silicon nitride film formed in this manner is processed by lithography and dry etching. The process to form the second silicon nitride film 12 over the gate electrode 3 will be described using FIGS. 7A to 7C.

Figure 7A:
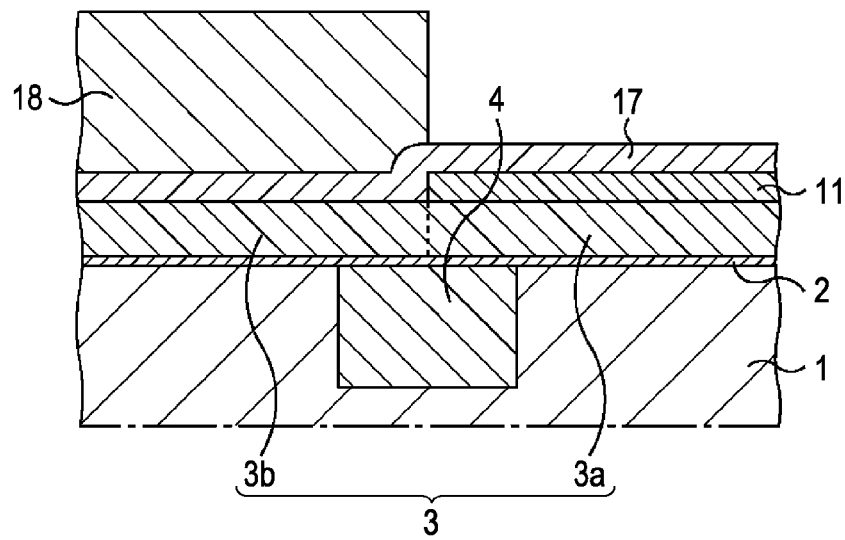
FIGS. 7A to 7C are sectional views of a process to form a first silicon nitride film and a second silicon nitride film.

In FIG. 7A, a silicon nitride film 17 is formed over the first silicon nitride film 11. A resist mask 18 is formed in a region of the silicon nitride film 17 formed over the whole surface corresponding to the p-type MOS transistor of the CMOS transistors 21 to 24.

Figure 7B:
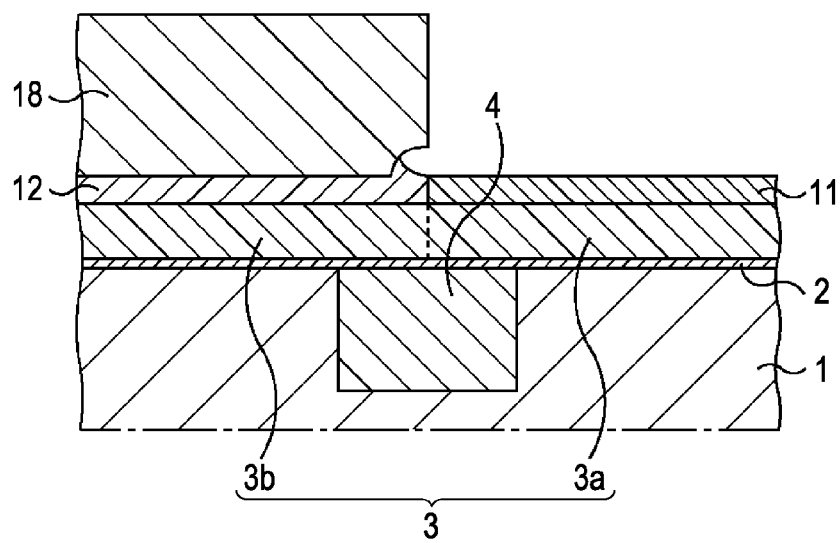

As shown in FIG. 7B, the resist mask 18 is used to etch the silicon nitride film 17. For example, phosphoric acid is used as an etchant to perform wet etching of a portion of the silicon nitride film 17 exposed from the resist mask 18. Accordingly, in addition to the portion of the silicon nitride film 17 exposed from the resist mask 18, the silicon nitride film 17 in an edge portion of the resist mask 18 is slightly removed by etching to form the second silicon nitride film 12. A swelling of the second silicon nitride film in a portion in contact with the first silicon nitride film 11 can be made smaller by using wet etching, but performing wet etching is not essential in the present invention and dry etching may also be performed.

Figure 7C:
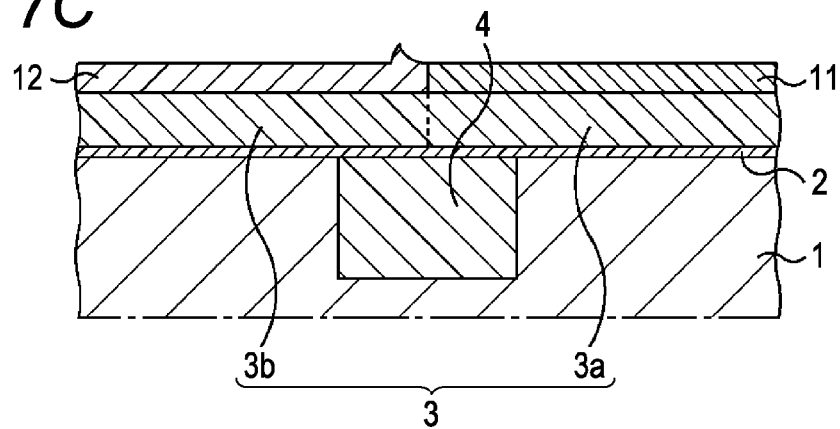

The resist mask 18 is removed by incineration or the like. Accordingly, as shown in FIG. 7C, the first silicon nitride film 11 and the second silicon nitride film 12 mutually in contact are formed.

In FIGS. 5D and 6D, the surface of the second silicon nitride film 12 is shown as a flat surface for convenience in illustration.

In the above process in which the first silicon nitride film 11 is formed, the fourth silicon nitride film 16 and the fifth silicon nitride film 25 are simultaneously formed and in the process in which the second silicon nitride film 12 is formed, the third silicon nitride film 15, and the sixth silicon nitride film 26 are simultaneously formed.

By undergoing the above process, there are formed the second silicon nitride film 12 over the p-type MOS transistor of the circuit block 10, the third silicon nitride film 15, and the sixth silicon nitride film 26 over the p-type MOS transistor of the CMOS transistors 21 and 24 in a portion other than the circuit block 10.

In the present embodiment, the first silicon nitride film 11 and the second silicon nitride film 12 are in contact through sides thereof opposite to each other and also, the second silicon nitride film 12 and the fourth silicon nitride film 16, the third silicon nitride film 15 and the fifth silicon nitride film 25, and the fourth silicon nitride film 16 and the sixth silicon nitride film 26 are each in contact through sides thereof opposite to each other.

In the present embodiment, the third silicon nitride film 15 is formed, for example, to a width of about 200 nm.

Then, an inter-layer insulating film is formed over the whole surface and a contact hole is formed in the inter-layer insulating film by using the first silicon nitride film 11 and the second silicon nitride film 12 as an etching stopper. Further, by etching the first silicon nitride film 11 and the second silicon nitride film 12, a portion of the surface of the source/drain regions 7/8 is exposed to embed a conductive material in the contact hole to form a wire extending in the inter-layer insulating film.

Figure 8A:
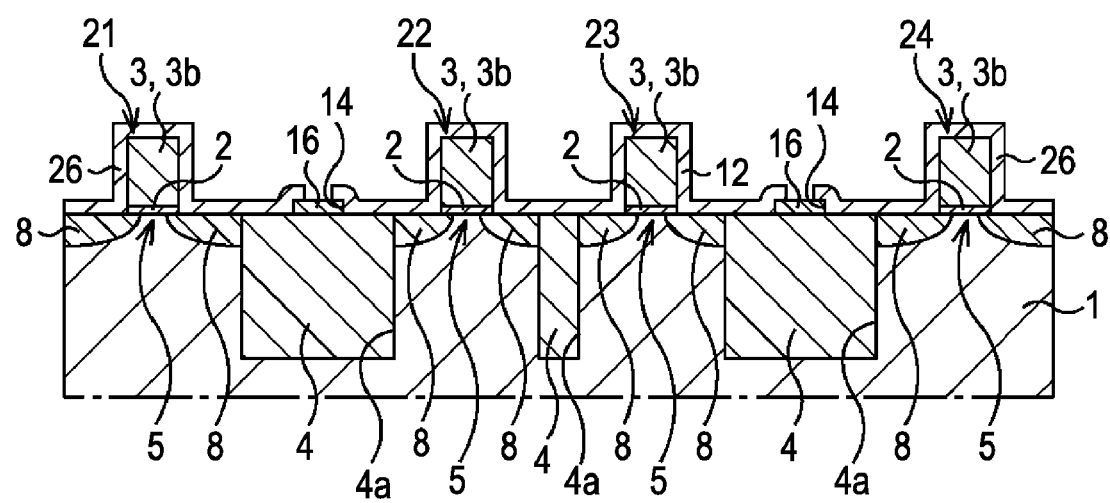
FIGS. 8A and 8B are schematic diagrams showing a first modification of the embodiment.
Figure 8B:
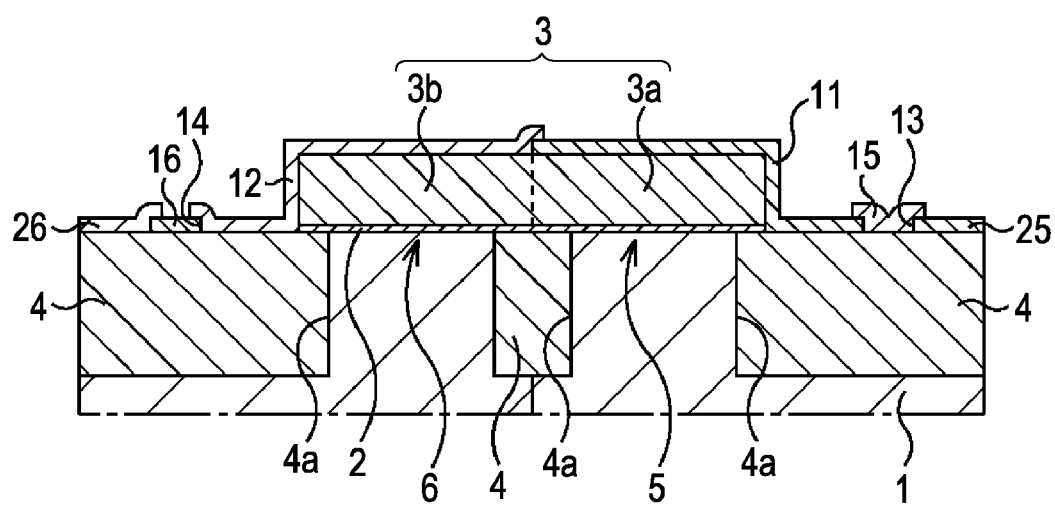

FIGS. 8A and 8B show sectional views of an LSI circuit according to the first modification of the embodiment. FIG. 8A is a sectional view corresponding to the I-I' line in FIG. 4A, and FIG. 8B is a sectional view corresponding to the II-II' line in FIG. 4A.

The present modification takes into consideration a mating margin of the second silicon nitride film 12 with respect to the first silicon nitride film 11 and the fourth silicon nitride film 16, that of the third silicon nitride film 15 with respect to the first silicon nitride film 11 and the fifth silicon nitride film 25, and that of the sixth silicon nitride film 26 with respect to the fourth silicon nitride film 16.

Here, each silicon nitride film is formed so that an edge portion of the second silicon nitride film 12 overlaps the first silicon nitride film 11 and the fourth silicon nitride film 16, that of the third silicon nitride film 15 overlaps the first silicon nitride film 11 and the fifth silicon nitride film 25, and that of the sixth silicon nitride film 26 overlaps the fourth silicon nitride film 16.

The width of the third silicon nitride film 15 in FIG. 8B is set, for example, at 250 nm and the interval between the first silicon nitride film and the fifth silicon nitride film is set, for example, at about 200 nm. An effect of the present invention can also be achieved by the structure shown in FIGS. 8A and 8B.

Figure 9A:
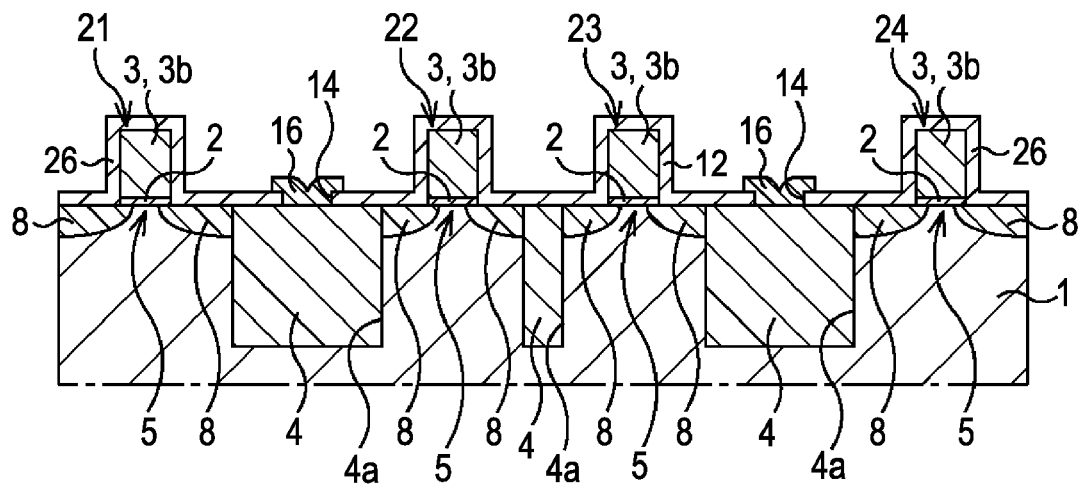
FIGS. 9A and 9B are schematic diagrams showing a second modification of the embodiment.
Figure 9B:
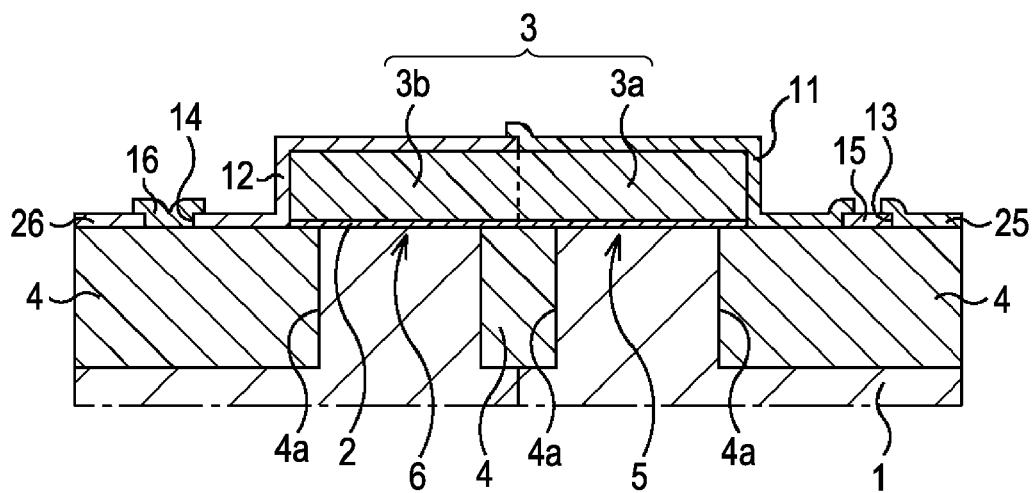

FIGS. 9A and 9B show sectional views of an LSI circuit according to the second modification. FIG. 9A is a sectional view corresponding to the I-I' line in FIG. 4A, and FIG. 9B is a sectional view corresponding to the II-II' line in FIG. 4A.

The present modification takes into consideration a mating margin of the first silicon nitride film 11 with respect to the second silicon nitride film 12 and the third silicon nitride film 15, that of the fourth silicon nitride film 16 with respect to the second silicon nitride film 12 and the sixth silicon nitride film 26, and that of the fifth silicon nitride film 25 with respect to the third silicon nitride film 15.

Here, each silicon nitride film is formed so that an edge portion of the first silicon nitride film 11 overlaps the second silicon nitride film 12 and the third silicon nitride film 15, that of the fourth silicon nitride film 16 overlaps the second silicon nitride film 12 and the sixth silicon nitride film 26, and that of the fifth silicon nitride film 25 overlaps the third silicon nitride film 15.

As described above, the width of the fourth silicon nitride film 16 is set, for example, at 250 nm and the interval between the second silicon nitride film 12 and the sixth silicon nitride film 26 is set, for example, at about 200 nm. An effect of the present invention can also be achieved by the structure shown in FIGS. 9A and 9B.

Figure 10A:
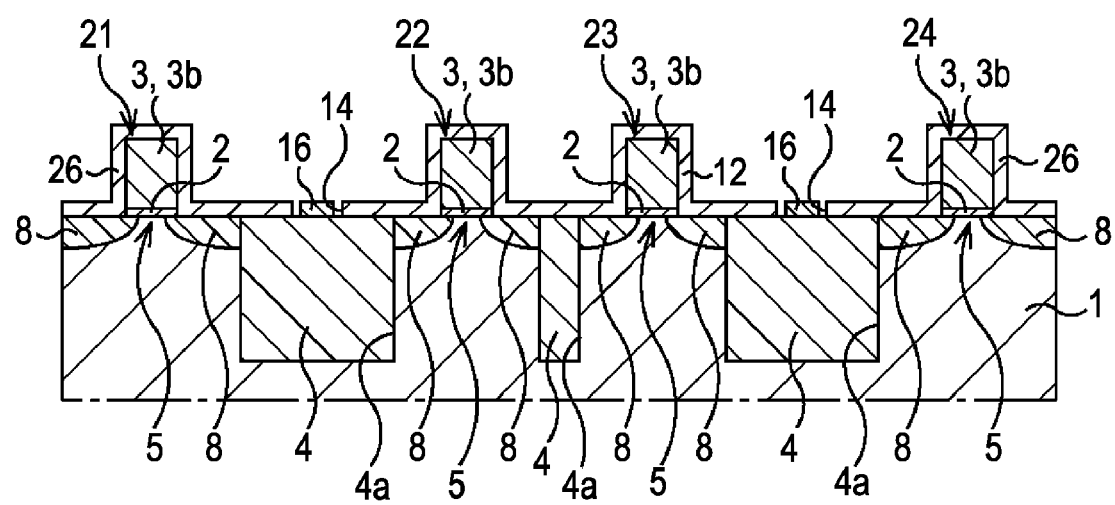
FIGS. 10A and 10B are schematic diagrams showing a third modification of the embodiment.
Figure 10B:
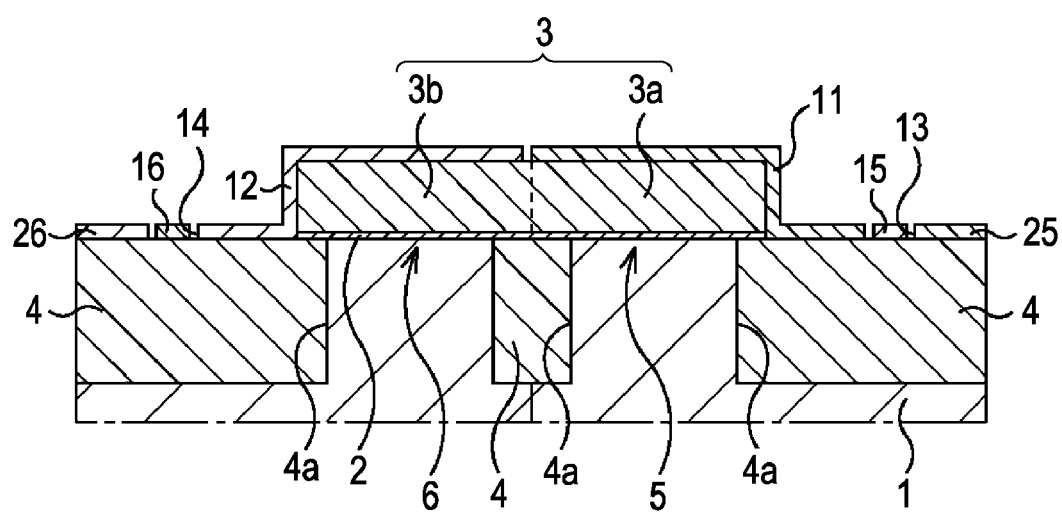

FIGS. 10A and 10B show sectional views of an LSI circuit according to the third modification. FIG. 10A is a sectional view corresponding to the I-I' line in FIG. 4A, and FIG. 10B is a sectional view corresponding to the II-II' line in FIG. 4A.

In the present modification, the width of the third silicon nitride film 15 is set, for example, at about 150 nm. The interval between the first silicon nitride film 11 and the fifth silicon nitride film 25 is set, for example, at about 200 nm.

The fifth silicon nitride film 25, the third silicon nitride film 15, the first silicon nitride film 11, the second silicon nitride film 12, the fourth silicon nitride film 16, and the sixth silicon nitride film 26 are formed as described above so that each is separated by an edge portion. An effect of the present invention can also be achieved by the structure shown in FIGS. 10A and 10B.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device comprising:
a semiconductor substrate;
a first impurity region including a first conductive impurity formed in the semiconductor substrate;
a first transistor and a second transistor formed in the first impurity region;
a first stress film having a first stress over the first transistor;
a second stress film having the first stress over the second transistor;
a third stress film having a second stress different from the first stress provided in the first impurity region between the first stress film and the second stress film;
a second impurity region including a second conductive impurity opposite to the first conductive impurity formed in the semiconductor substrate;
a third transistor and a fourth transistor formed in the second impurity region;
a fourth stress film having a third stress over a third transistor;
a fifth stress film having a the third stress over the fourth transistor; and
a sixth stress film having a fourth stress different from the third stress provided between the fourth stress film and the fifth stress film in the second impurity region.

2. The semiconductor device according to claim 1, wherein the first stress is identical to the fourth stress.

3. The semiconductor device according to claim 1, wherein the first stress and the fourth stress are tensile stress and the second stress and the third stress are compressive stress.

4. The semiconductor device according to claim 1, wherein the first stress film is in contact with the fourth stress film, and
the third stress film is in contact with the sixth stress film.

5. The semiconductor device according to claim 4, wherein the first stress film and the second stress film are separated by the third stress film and the sixth stress film.

6. The semiconductor device according to claim 1, further comprising:
an element isolation insulating film provided between the first transistor and the second transistor in the first impurity region.

7. The semiconductor device according to claim 6, wherein the third stress film is formed over the element isolation insulating film.

8. A semiconductor device comprising:
a semiconductor substrate;
a first transistor of a first conductive type formed over the semiconductor substrate;
a second transistor of the first conductive type parallel to the first transistor and adjacent to the first transistor;
a first stress film having a first stress over the first transistor;

a second stress film having the first stress over the second transistor;

a third stress film having a second stress different from the first stress provided between the first stress film and second stress film;

a third transistor of a second conductive type opposite to the first conductive type formed over the semiconductor substrate;

a fourth transistor of the second conductive type parallel to the third transistor and adjacent to the third transistor;

a fourth stress film having a third stress over the third transistor;

a fifth stress film having the third stress over the fourth transistor; and a sixth stress film having a fourth stress different from the third stress provided between the fourth stress and the fifth stress film.

9. The semiconductor device according to claim 8, wherein the first stress is identical to the fourth stress.

10. The semiconductor device according to claim 8, wherein
the first stress film is in contact with the fourth stress film, and
the third stress film is in contact with the sixth stress film.

11. The semiconductor device according to claim 8, further comprising:
an element isolation insulating film provided between the first transistor and the second transistor.

12. The semiconductor device according to claim 11, wherein
the third stress film is formed over the element isolation insulating film.

13. The semiconductor device according to claim 8, wherein
the first stress film and the second stress film are separated by the third stress film and the sixth stress film.

14. A semiconductor device comprising:
a first impurity region having a first conductive type impurity;
an element isolation insulating film in contact with the first impurity region;
a second impurity region in contact with the element isolation insulating film, provided at a position opposite to the first impurity region, and having the first conductive type impurity;
a first transistor formed over the first impurity region;
a second transistor formed over the second impurity region;
a first stress film having a first stress formed over the first transistor;
a second stress film having the first stress formed over the second transistor; and
a third stress film having a second stress different from the first stress formed over the element isolation insulating film;
wherein the first stress film and the second stress film overlap the third stress film, or the third stress film overlaps the first stress film and the second stress film.

15. The semiconductor device according to claim 14, wherein
the first stress is opposite in a direction to the second stress.

16. The semiconductor device according to claim 14, wherein
the first stress film and the second stress film are free of contact with the third stress film so as to form a first interval between the first and third film and a second interval between the second and third film.

* * * * *